United States Patent [19]

Okuyama et al.

[11] 4,247,950
[45] Jan. 27, 1981

[54] DISPLAY FOR FREQUENCY RECEIVED BY RADIO RECEIVER

[75] Inventors: Yasuhiko Okuyama; Takeshi Takiya, both of Gunma, Japan

[73] Assignees: Sanyo Electric Co., Ltd., Moriguchi; Tokyo Sanyo Electric Co., Ltd., Oora, both of Japan

[21] Appl. No.: 17,061

[22] Filed: Mar. 2, 1979

[30] Foreign Application Priority Data

Mar. 13, 1978 [JP] Japan ................................. 53-29693
Mar. 13, 1978 [JP] Japan ............................. 53-33164[U]

[51] Int. Cl.$^3$ .............................................. H04B 1/26
[52] U.S. Cl. ...................................... 455/158; 331/64; 334/86
[58] Field of Search ........................ 325/455; 334/86; 331/64; 324/78 D, 79 D; 235/92 FQ; 455/154, 157, 158

[56] References Cited

U.S. PATENT DOCUMENTS

| | | | |
|---|---|---|---|
| 3,753,119 | 8/1973 | Close | 325/455 |
| 3,885,218 | 5/1975 | Pfab | 325/455 |
| 4,163,943 | 8/1979 | Miki et al. | 325/455 |

Primary Examiner—Marc E. Bookbinder
Attorney, Agent, or Firm—Darby & Darby

[57] ABSTRACT

A display in a superheterodyne receiver having a local oscillator, adapted for displaying in a digital manner the frequency of a signal being received by the receiver by counting the local oscillation frequency by means of a preset counter wherein the data for the prescribed intermediate frequency or the complement thereof is preset. A reference voltage is generated by means of a variable resistor for correcting the difference between the preset value for the prescribed intermediate frequency and the actual intermediate frequency of the intermediate frequency stage of a receiver as actually manufactured, and a comparison voltage is obtained by digital/analog converting the output of a multiple-bit counter which is stepped responsive to clock pulses. The reference voltage and the comparison voltage are compared and the preset counter is supplied through a gate controlled responsive to the comparison output with the clock pulses of the number associated with the difference between both voltages, whereby the preset value in the preset counter is corrected.

20 Claims, 12 Drawing Figures

DISPLAY FOR FREQUENCY RECEIVED BY RADIO RECEIVER

BACKGROUND OF THE INVENTION

1. Field of the Invention

The present invention relates to an apparatus for displaying a frequency received by a radio receiver. More specifically, the present invention relates to an apparatus for displaying in a digital manner a frequency being received by a radio receiver by counting the local oscillation frequency pulses obtainable from a local oscillator of the radio receiver.

2. Description of the Prior Art

It has been proposed that the frequency of a signal received by a radio receiver be displayed in a digital manner. For example, U.S. Pat. No. 3,244,983, issued Apr. 5, 1966 to Robert J. Ertman and entitled "Continuously Tunable Direct Reading High Frequency Converter" discloses that a numerical value associated with the intermediate frequency is preset in a preset counter and the local oscillation frequency is evaluated by counting the local oscillation frequency output by means of the said preset counter, whereupon the count value is displayed in a digital manner. On the other hand, the actual intermediate frequency of the respective radio receivers, as manufactured, is determined by the accuracy of adjustment of the intermediate frequency transformers, the frequency characteristic of ceramic filters used in the intermediate frequency amplifiers, and the like. However, it is usually not possible to achieve exactly the same adjustment of the intermediate frequency transformers or obtain ceramic filters of exactly the same frequency characteristics in all the radio receivers, as manufactured, and thus some deviation of the actual intermediate frequency of the intermediate frequency stage unavoidably results among the radio receivers, as mass-produced. Hence, it is appreciated that only if a predetermined numerical value associated with the prescribed intermediate frequency is fixedly preset in the preset counter, then some frequency deviation occurs in indicating of the frequency being received. Thus, ideally it is necessary to correct the numerical value being preset in the preset counter in association with the deviation of the intermediate frequency of the intermediate frequency stage of the respective radio receivers by virtue of the deviation of adjustment of the intermediate frequency transformers, the frequency characteristics of the ceramic filters and the like. However, since it was conventionally adapted such that the preset numerical value was read out from a masked read only memory, for example, it was impossible to make such correction of the preset value. Thus, it was required that the accuracy of adjustment of the intermediate frequency transformers be strictly controlled or that ceramic filters of an accurate frequency characteristic were selected, which caused an increase of the cost.

On the other hand, Japanese Patent Publication Gazette No. 44167/1977, as published Nov. 5, 1977 for opposition, discloses a dial display in a radio receiver, wherein in order to avoid ±1 count error occurring in the least significant digit of the displayed number counters are used the number of which is larger by at least one digit than the number of digits being displayed so that the additional counter is allotted for the digit position less significant than the least significant digit of the number being displayed and, for example, the number "5" is preset in the additional counter, whereby the number being displayed is rounded at the digit less significant than the least significant digit so as to count fractions of 5 and over as a whole number and to disregard the rest, with the result that an error is eliminated from an apparent digital display. Even such prior art display involves a problem to be solved and hence leaves room for improvement. More specifically, according to the above described approach, the preset value per se is not corrected in association with the deviation of the actual intermediate frequency of the receivers from the prescribed intermediate frequency but instead the displayed number is merely rounded at an additional digit position less significant than the least significant digit of the number being displayed, thereby to achieve an apparently corrected digital display of the frequency being received. Therefore, if and when deviations of the adjustment of the intermediate frequency transformers or the deviation of the frequency characteristic of the ceramic filters used in the intermediate frequency amplifiers exceeds the range in which any error can be eliminated in accordance with the above described approach disclosed in the referenced Japanese Patent Publication Gazette, then it follows that such deviation appears as an error in indicating the frequency being received which is made in the conventional display. In other words, the approach disclosed in the above referenced Japanese Patent Publication Gazette merely broadens a permissible error range in which an error of adjustment of the intermediate frequency transformers or an error of the frequency characteristic of the ceramic filters is permissible and totally fails to provide any scheme for correcting the preset value per se fundamentally in association with such deviation.

SUMMARY OF THE INVENTION

The present invention utilizes a decimal counter for counting the local oscillation frequency signal for the purpose of a digital display of the frequency being received. The value in the counter is subjected to addition or subtraction of a predetermined numerical value associated with the intermediate frequency before or after the counting operation. To that end, a correcting reference voltage is generated for the purpose of correcting the deviation between the actually set intermediate frequency, i.e. the resonance frequency in the intermediate frequency stage and the prescribed intermediate frequency being added or subtracted. On the other hand, a comparison voltage is also generated. In a preferred embodiment, the comparison voltage is generated by counting the proper clock pulses by the use of a multiple bit counter and by converting the count value into an analog voltage. The comparison voltage is compared with the correcting reference voltage. A correction numerical value associated with the difference between the comparison voltage and the correcting reference voltage is added to or subtracted from the value in the counter, whereby the above described numerical value concerning the prescribed intermediate frequency being added or subtracted is corrected.

According to the present invention, the numerical value being preset in the counter or the numerical value being added to or subtracted from the value in the counter in association with the deviation of the actual intermediate frequency from the prescribed intermediate frequency which numerical value is associated with the numerical value concerning the intermediate frequency or the complement thereof is corrected by the value commensurate with the deviation. Therefore, a correct digital display can be made of the frequency being received, irrespective of missalignment of the intermediate frequency transformers, deviation of the frequency of the ceramic filters and the like. In other words, strict requirement of accurate alignment of the intermediate frequency transformers, strict control of the frequency characteristic of the ceramic filters and the like in the conventional digital display of the frequency being received in radio receivers can be eliminated according to the present invention and hence the cost of manufacture can be decreased. Nevertheless, the range in which such deviation can be corrected is large according to the present invention and thus any inconvenience of the limited range of permissible deviation as encountered in the above referenced Japanese Patent Publication Gazette can also be eliminated. In addition, according to the present invention, extremely accurate correction can be performed, when the reference voltage is compared with a signal obtained by counting the clock pulses by a multiple bit counters and converting the count value into an analog and making correction in association with the deviation of the actual resonance frequency in the intermediate frequency stage from the prescribed intermediate frequency through such comparison. Thus, a circuit for such correction can be implemented in a simple structure.

Therefore, a principal object of the present invention is to provide an improved display of a frequency received by a radio receiver.

Another object of the present invention is to provide a display for a frequency being received by a radio receiver, wherein deviation of the actual resonance frequency in the intermediate frequency stage in the radio receiver from the prescribed intermediate frequency can be accurately corrected, by the use of a relatively simple circuit configuration, whereby the frequency being received can be accurately displayed.

A further object of the present invention is to provide a display for a frequency being received by a radio receiver, wherein comparison is made between a reference voltage for correction and an analog voltage obtained by converting the output of a multiple bit counter into an analog signal, whereupon the numerical value for correction is determined.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
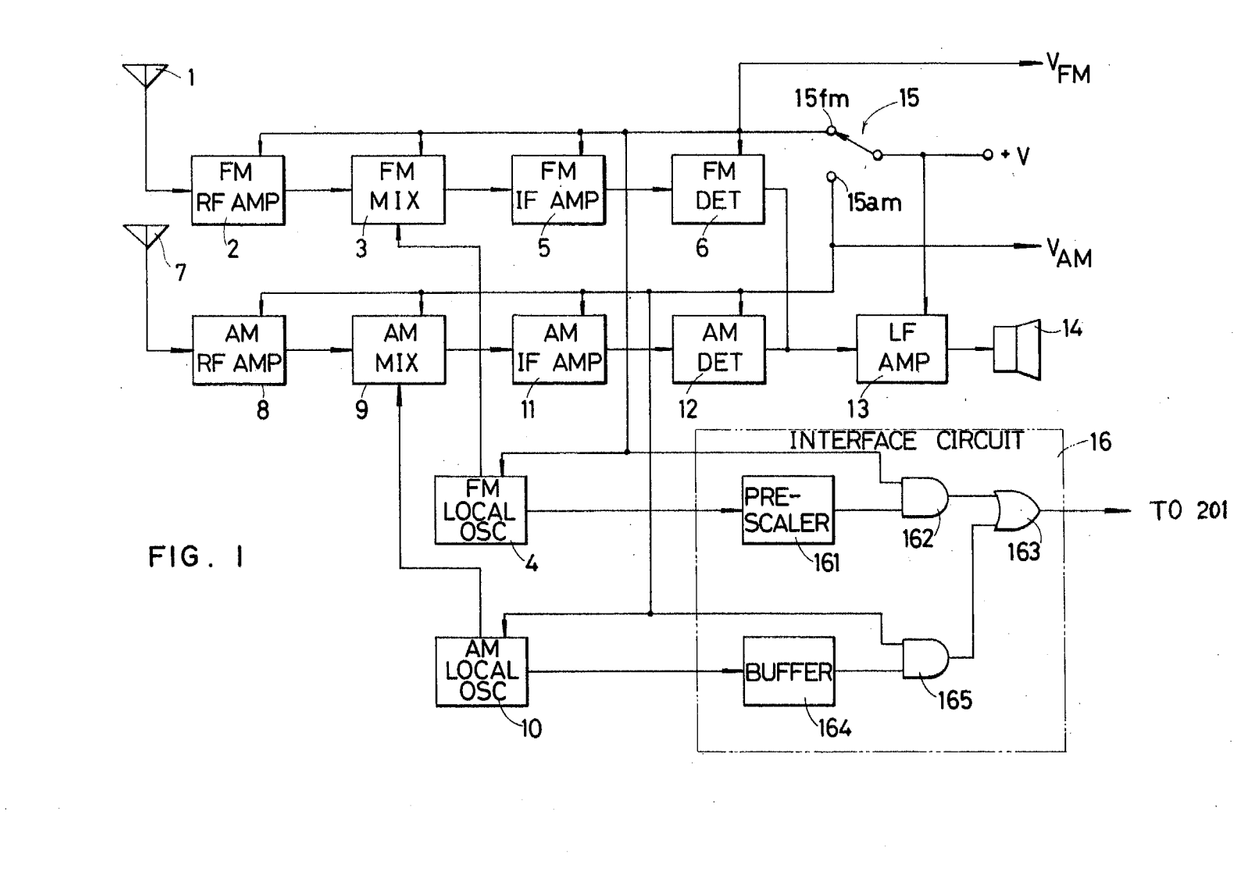
FIG. 1 shows a block diagram of one example of a radio receiver in which the present invention can be advantageously employed.

FIG. 1 shows a block diagram of one example of a two-band radio receiver, wherein the present invention can be advantageously employed. Referring to FIG. 1, an FM broadcasting signal received by an FM antenna 1 is amplified by an FM radio frequency amplifier 2 and is applied to an FM mixer 3. The FM mixer 3 mixes the high frequency signal thus obtained with a local oscillation frequency signal obtained by an FM local oscillator 4 to provide an FM intermediate frequency signal. The FM intermediate frequency signal obtained from the FM mixer 3 is amplified by an FM intermediate frequency amplifier 5 and is applied to an FM detector 6. The detector 6 detects a modulating signal from the intermediate frequency signal and the modulating signal of the low frequency thus obtained is applied to a low frequency amplifier 13. The amplified low frequency output obtained from the amplifier 13 is applied to a speaker 14 to drive the same, whereby the FM radio broadcasting signal is reproduced to. For the purpose of selecting reception of the FM broadcasting, a band selection switch 15 is turned to an FM contact 15fm, when a voltage $V_{FM}$ for FM selection is applied to the blocks 2, 3, 4, 5 and 6. The low frequency amplifier 13 is supplied with a voltage $+V$ from a voltage source, not shown. On the other hand, when the band selection switch 15 is turned to an AM contact 15am for the purpose of selection of the AM broadcasting, then a voltage $V_{AM}$ for selection of the AM band is applied to blocks 8, 9, 10, 11 and 12. An AM signal received by an AM antenna 7 is amplified by the AM high frequency amplifier 8 and is applied to the AM mixer 9. The AM mixer 9 mixes the high frequency signal thus obtained with a local oscillation frequency signal obtained from an AM local oscillator 10 to provide an AM intermediate frequency signal. The AM intermediate frequency signal thus obtained from the AM mixer 9 is amplified by the AM intermediate frequency amplifier 11 and is applied to the AM detector 12. The detector 12 detects a modulating signal from the AM intermediate frequency signal and the detected output of the low frequency is applied to the low frequency amplifier 13. Again the low frequency amplifier 13 drives the speaker 14, whereby the AM radio broadcasting signal is reproduced. Since a more detailed structure of such radio receiver and the operation thereof are well known to those skilled in the art, it is not believed necessary to describe the same in more detail.

Referring to FIG. 1, the FM local oscillation frequency signal obtained from the FM local oscillator 4 and the AM local oscillation frequency signal obtained from the AM local oscillator 10 are both applied to an interface circuit 16. The interface circuit 16 comprises a frequency divider, or prescaler, 161 connected to receive the FM local oscillation frequency signal and a buffer 164 connected to receive the AM local oscillation frequency signal. The prescaler 161 is adapted to frequency divide the applied FM local oscillation frequency signal by the factor of 1/100 and the output of the prescaler 161 is applied to an AND gate 162 as one input thereto. The buffer 164 serves to apply the AM local oscillation frequency signal to an AND gate 165 as one input thereto. The AND gate 162 is connected to receive, as the other input thereto, the voltage $V_{FM}$ obtainable when the FM band is selected and the AND gate 165 is connected to receive, as the other input thereto, the voltage $V_{AM}$ obtainable when the AM band is selected. More specifically, if and when the FM band is selected, the local oscillation frequency signal as frequency divided by the prescaler 161 is obtained from the AND gate 162, and if and when the AM band is selected, the AM local oscillation frequency signal is obtained from the AND gate 165. These outputs are withdrawn through an OR gate 163 as the output of the interface circuit 16, which is then applied to an AND gate 201 shown in FIG. 2 as one input thereto. The prescaler 161 employed for frequency division of the FM local oscillation frequency signal may be merely a buffer as employed in the AM band circuit, in which case the interface circuit 16 may be a mere switching circuit.

Figure 2:
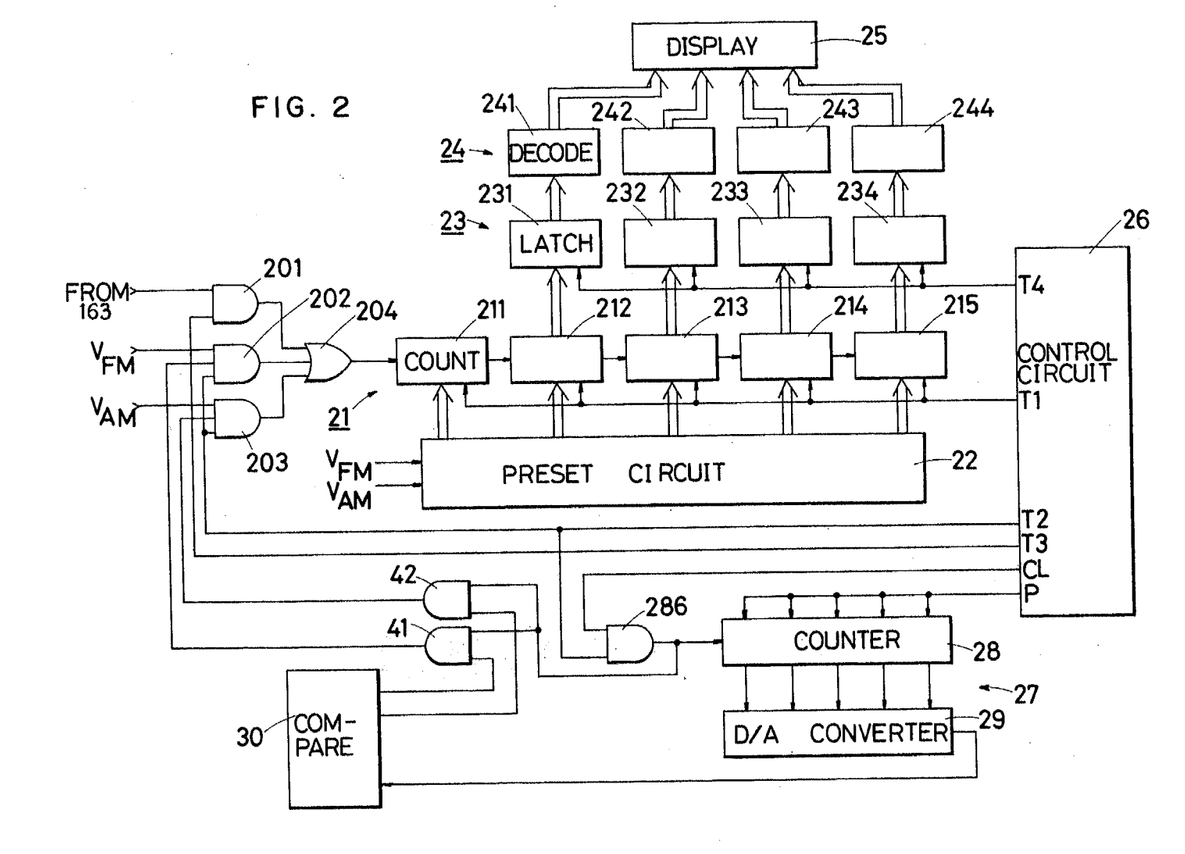
FIG. 2 shows a block diagram of one embodiment of the present invention.
Figure 3:
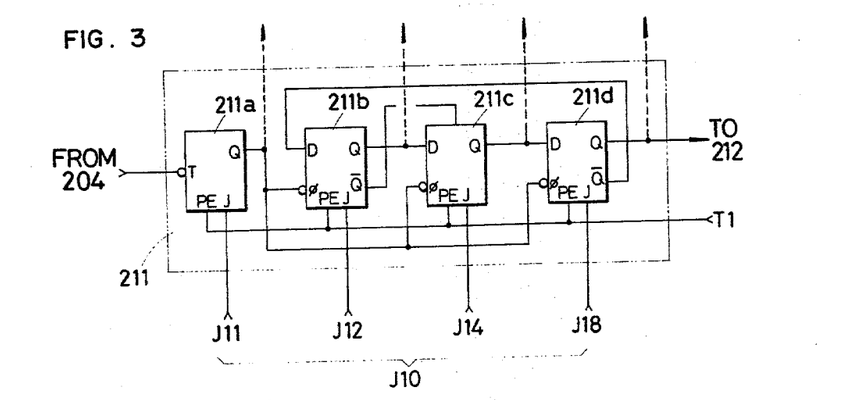
FIG. 3 shows in more detail one example of a preset decimal counter shown in FIG. 2.

FIG. 2 is a block diagram showing a major portion of the present invention. As described previously, if and when the FM band is selected, the AND gate 201 is supplied with the FM local oscillation frequency signal as frequency divided by the prescaler 161 from the interface 16. If and when the AM band is selected, the AND gate 201 is supplied with the AM local oscillation frequency signal from the interface circuit 16. The AND gate 201 is supplied, at the other input thereto, with a timing signal T3 obtained from a control circuit 26. The output of the AND gate 201 is applied to an OR gate 204 as one input thereto. The OR gate 204 is also connected to receive, as further inputs thereto, the output of AND gates 202 and 203. The AND gate 202 is connected to receive the above described FM band voltage $V_{FM}$, a timing signal T2 obtained from the control circuit 26 and the output of an AND gate 41. The AND gate 203 is connected to receive the above described AM band voltage $V_{AM}$, the timing signal T2 and the output of an AND gate 42. Accordingly, the outputs of the AND gates 201, 202 and 203 are withdrawn through the OR gate 204 and are applied to a presettable decimal counter 21 as a count input. The decimal counter 21 is implemented by connecting, in a cascade fashion, counters 211, 212, 213, 214 and 215 so as to constitute five digits. One of the counters, such as the counter 211, of the presettable decimal counter 21 may be structured as shown in FIG. 3, for example. The remaining counters 212, 213, 214 and 215 may be structured in substantially the same circuit configuration as that of the counter 211. The outputs of these counters 212, 213, 214 and 215 are applied, in a bit parallel fashion, as more fully shown by dotted lines in FIG. 3, to the corresponding ones 231, 232, 233 and 234, respectively, of a latch circuit 23. The counter 211 comprises four cells or flip-flops 211a, 211b, 211c and 211d, each of which is provided with a preset enable terminal PE. If and when the timing signal T1 is applied from the timing control circuit 26 to the preset enable terminal PE of each of the cells, the respective cells 211a, 211b, 211c and 211d are loaded with the corresponding bit outputs J11, J12, J14 and J18, generally denoted as the 4-bit output J10, respectively, obtained from the preset circuit 22. One of the cells, i.e. the flip-flop 211a is structured as a trigger flip-flop, a trigger input of which is connected to receive a signal from the OR gate 204. The output of the final stage bit 211d of the counter 211 is applied to the counter 212 of the subsequent stage.

The latch circuits 231 to 234 receive the timing signal T4 from the control 26 as a latch timing signal. If and when the above described latch timing signal T4 is obtained, the latch circuits 231 to 234 latch the outputs of the corresponding counters. More specifically, the latch circuits 231 to 234 are responsive to the latch timing signal T4 to be loaded with the outputs of the corresponding counters 212 to 215 and retains the same until the following latch timing signal is received. Basically, the latch circuits 231 to 234 may be implemented by flip-flops. The outputs of the latch circuits 231, 232, 233 and 234 are applied in a bit parallel fashion to the inputs of display decoders 241, 242, 243 and 244, respectively, generally denoted as 24. The display decoders 241 to 244 are structured to convert or decode a signal to a segment selection signal, for example, in the manner well known to those skilled in the art. A display 25 may comprise four digit display positions, each comprising an arrangement of segments in the form of numeral "8" such that selective energization of the segments may constitutes an indication of a selected one of numerals 0, 1, 2, ... 9, as well known to those skilled in the art and the respective digit positions of the display 25 are connected to receive the segment selection signal from the decoders 241, 242, 243 and 244, respectively.

Figure 4:
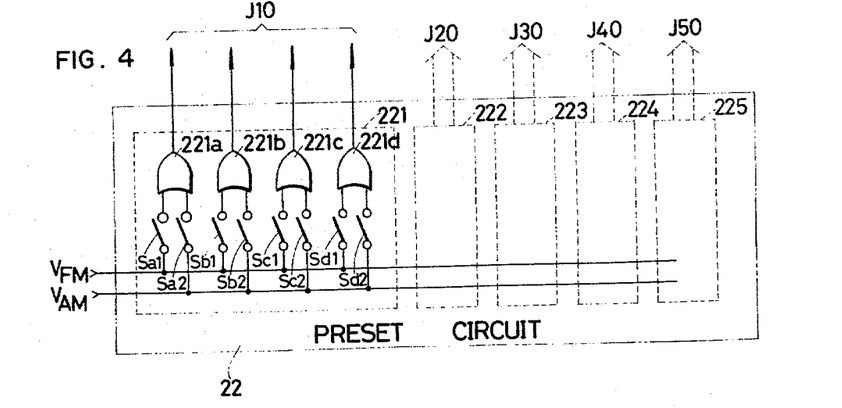
FIG. 4 is a diagram showing in more detail one example of a preset circuit shown in FIG. 2.

FIG. 4 is a diagram showing in more detail one example of a preset circuit 22 shown in FIG. 2. It is pointed out that in FIG. 4 only a circuit configuration of the most significant digit portion 221 is shown in detail, while the remaining four digit portions 222, 223, 224 and 225 are merely shown by dotted blocks, inasmuch as these remaining digit portions may be implemented in exactly the same structure. Accordingly, only one digit portion 221 will be described, representing the others. The circuit 221 comprises OR gates 221a, 221b, 221c and 221d corresponding to the bits J11, J12, J14 and J18, respectively, of the preset data output J10. The preset circuit 22 is also connected to receive the above described FM band voltage $V_{FM}$ and the AM band voltage $V_{AM}$. The OR gate 221a is connected to receive the voltage $V_{FM}$ through a switch Sa1 and the voltage $V_{AM}$ through a switch Sa2. Accordingly, if and when the FM band is selected, for example, the switch Sa1 is turned on, so that the high level output or the output of the logic one is obtained as the output of the OR gate 221a or the preset data J11. If and when the switch Sa1 is turned off, then the data J11 is the low level or the logic zero. The other OR gates 221b, 221c and 221d and the switches Sb1, Sb2, Sc1, Sc2, Sd1 and Sd2 also function in the same manner. Thus, the preset data outputs J10 to J50 are obtained from the preset circuit 22 corresponding to the five digit decimal counters 211 to 215, respectively.

Figure 5:
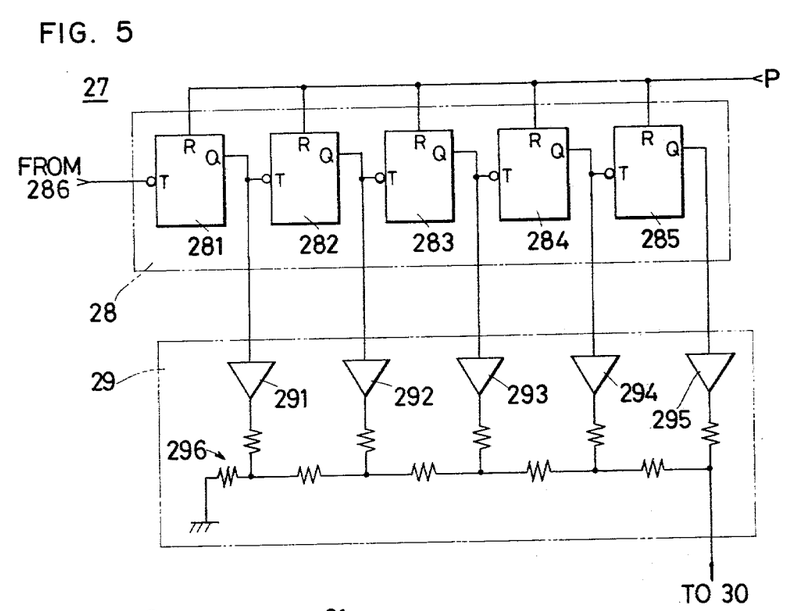
FIG. 5 is a diagram showing in more detail a comparison signal generator shown in FIG. 2.

Returning again to FIG. 2, the embodiment shown comprises a comparison signal generator 27 and a compare circuit 30, which constitute one essential feature of the present invention. The comparison signal generator 27 comprises a five-bit counter 28 and a digital/analog converter 29 for converting the output of the counter 28 into an analog voltage. The counter 28 and the digital- /analog converter 29 are shown in more detail in FIG. 5. The counter 28 comprises five cells or T-type flip-flops 281, 282, 283, 284 and 285. Each of the cells or flip-flops 281 to 285 comprises a reset terminal R, which is connected to receive a reset signal P from the control circuit 26. The count input of the counter 28 is connected to receive the clock pulse CL from the control circuit 26 through an AND gate 286. The output of each cell or bit of the counter 28 is applied to the input of each of the buffers 291, 292, 293, 294 and 295 of the respective bits of the digital/analog converter 29. The outputs of the buffers 291 to 295 are connected in a bit parallel fashion to a ladder network 296. Accordingly, in analog voltage associated with the state of the counter 28 is obtained from one end or the output end of the ladder network to the compare circuit 30 as a comparison voltage. The AND gate 286 is connected, as one input thereto, to receive the timing signal T2 from the control circuit 26 and is further connected to receive, as the other input thereto, the clock pulse CL from the control circuit 26. The output of the AND gate 286 is applied to the count input of the counter 28, as described previously, and also applied, as one input thereto, to each of the AND gates 41 and 42. Each of the AND gates 41 and 42 is connected to receive, as the other input thereto, the comparison output signal from the compare circuit 30, so that one AND gate 41 is effective for the FM band and the other AND gate 42 is effective for the AM band. The compare circuit 30 is also connected to receive a comparison signal voltage from the digital/analog converter 29.

Figure 6:
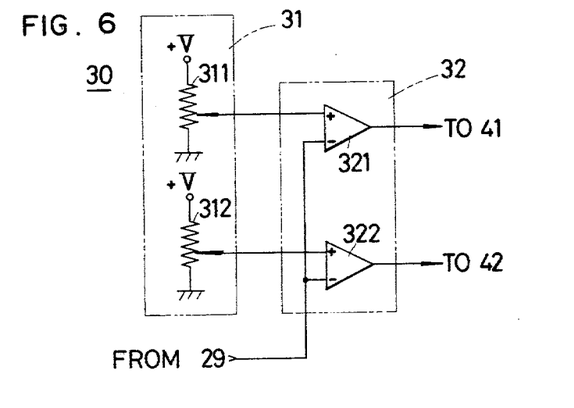
FIG. 6 is a diagram showing in more detail one example of a comparator shown in FIG. 2.

FIG. 6 is a schematic diagram showing in more detail the compare circuit 30. The compare circuit 30 comprises a reference voltage generator 31 and a comparator 32. The reference voltage generator 31 comprises two variable resistors 311 and 312. The variable resistor 311 is adapted for making a correction in conjunction with the deviation of the intermediate frequency of the intermediate frequency stage with respect to the FM band and the other variable resistor 312 is adapted for making a correction in conjunction with the deviation of the intermediate frequency in the intermediate frequency stage with respect to the AM band. The variable resistor 311 is adjusted in association with the deviation of the intermediate frequency in the intermediate frequency stage with respect to the FM band, whereby the reference voltage for making compensation in conjunction with the intermediate frequency for the FM band is applied, as one input thereto, to the comparator 321 included in the comparator 32. Similarly, the variable resistor 312 for the AM band serves to provide the reference voltage for making compensation in conjunction with the intermediate frequency of the AM band as adjusted in association with the deviation of the intermediate frequency in the intermediate frequency stage with respect to the AM band. The other input of each of the comparators 321 and 322 is connected to receive the output of the above described comparison signal voltage, i.e. the output of the digital/analog converter 29. The comparators 321 and 322 provide an output of a high level or the logic one if and when the comparison signal voltage applied to the minus inputs of the comparators 321 and 322 is smaller than the reference voltage applied to the plus inputs of the comparators 321 and 322. The output of the comparator 321 is applied to the above described AND gate 41 and the output of the comparator 322 is applied to the AND gate 42.

Figure 7:
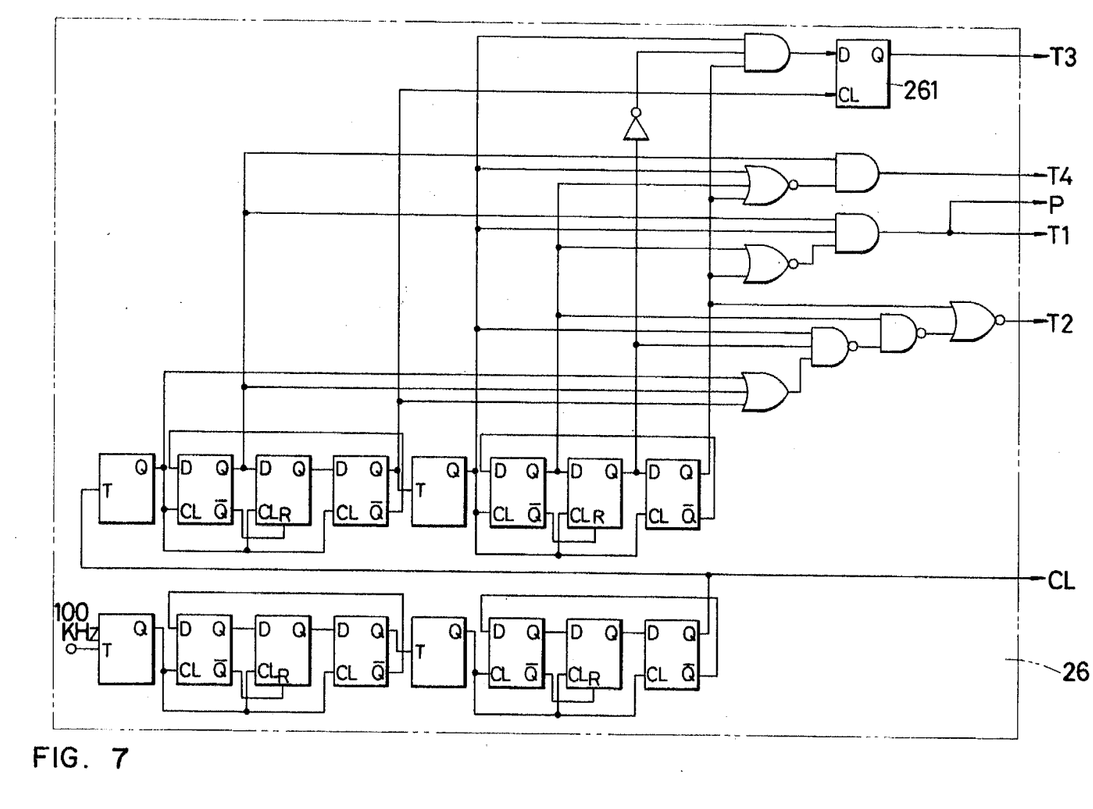
FIG. 7 is a diagram showing in more detail a control circuit shown in FIG. 2.

FIG. 7 is a block diagram showing one example of the control circuit 26. The embodiment shown comprises a counter connected to receive, as a count input, the clock signal of 100 kHz. The counter is further structured to provide the timing signals T1, T2, T3 and T4, the reset signal P and the clock signal CL from the respective positions. As described previously, the timing signal T3 is applied to the other input of the AND gate 201. The AND gate 201 serves to provide the FM local oscillation frequency signal or the AM local oscillation frequency signal from the interface circuit 16 to the counter 21 for the purpose of counting the frequency being received by means of the decimal counter 21. Accordingly, the time period of the timing signal T3 for controlling the AND gate 201 must be determined in relation to the minimum frequency that can be counted by the counter 21. More specifically, assuming that the time period of the timing signal T3 is t0 and the minimum frequency that can be counted by the counter 21 is f0, then $t0 \times f0 = 1$ (sec.Hz). Accordingly, in case where the minimum frequency f0 is 100 Hz, then the time period t0 of the timing signal T3 is 10 m sec. In case where a frequency divider or prescaler of the frequency division rate of 1/N is employed in the interface circuit 16, then the equation $t0 \times f0/N = 1$ (sec.Hz) must be met. In the embodiment shown, a prescaler 161 having a frequency division rate of 1/100 is employed for the FM band. Assuming that the minimum frequency that is counted by the counter 21 in the FM band is 10 kHz, then the time relation is t0=10 m sec. Accordingly, the flip-flop 261 adapted for providing the timing signal T3 in the control circuit 26 is structured such that the input is selected so as to maintain the output Q for the time period of 10 m sec. at least. Meanwhile, the time period t0 is varied depending on a specific frequency division rate by the prescaler and the minimum frequency being received.

Since the structural features of the embodiment shown where described in the foregoing, the operation of the embodiment shown will be described in the following with reference to FIG. 8. If and when a power supply switch, not shown, is turned on, the control circuit 26 specifically shown in FIG. 7 is energized. The band selection switch 15 shown in FIG. 1 is turned to the AM contact 15am, for example. Accordingly, the AM band voltage $V_{AM}$ is applied to the relevant circuit portion in FIG. 1, whereby the corresponding circuit is energized.

Figure 8:
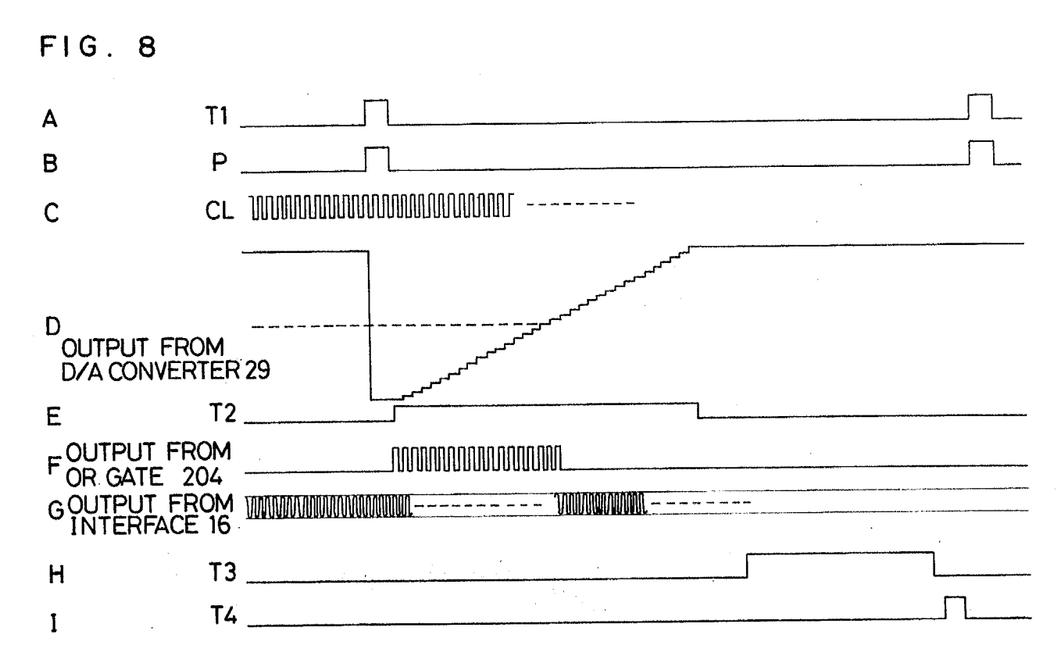
FIG. 8 shows waveforms of the signals for explaining the operation of the FIG. 2 embodiment.

Upon energization of the control circuit 26, the clock pulse CL as shown in FIG. 8C is obtained, while the timing signal T1 and the reset signal P as shown in FIGS. 8A and 8B, respectively, are obtained. The timing signal T1 is applied to the presettable decimal counter 21 as a preset enable signal, as better seen from FIG. 2. Accordingly, the respective digit counters 211, 212, 213, 214 and 215 of the preset counter 21 are each preloaded with the corresponding preset values J10, J20, J30, J40 and J50 obtainable from the preset circuit 22 (FIG. 4). Since the preset circuit 22 has been supplied with the AM band voltage $V_{AM}$ on that occasion, the preset value of the AM band is obtained from the preset circuit 22. The preset value for the AM band is determined in the following manner. The local oscillation frequency of the AM band is normally selected to be higher than the frequency being received by the frequency difference commensurate with the intermediate frequency. Accordingly, the count value in the preset counter 21 must be decreased in advance by the value corresponding to the intermediate frequency, say 455 kHz, by means of the preset circuit 22. More specifically, at the beginning, the respective digit counters 211, 212, 213, 214 and 215 of the present counter 211 assume the values 0, 0, 0, 0 and 0, respectively. Therefore, when the numerical value 455 is subtracted therefrom, then 100000−455−16=99529. Thus, the numerical value "99529" is a value being preset for the AM band. It should be pointed out that in the above described equation the numerical value "16" was further subtracted, because a more effective correction is aimed, as to be more fully described subsequently. Therefore, the switches Sa2, Sb2, Sc2 and Sd2 are selectively turned on, so that the output data J10 from the preset circuit 22 shown in FIG. 4 may be the numerical value "9", the data J20 may be the value "2", the data J30 may be the value "5", the data J40 may be the value "9" and the data J50 may be the value "9". If and when the timing signal T1 is obtained in such situation, the preset counter 20 is preloaded with the preset value obtainable from the preset circuit 22.

Simultaneously with the timing signal T1, the reset signal P is obtained from the control circuit 26 and is applied to the counter 28 included in the comparison signal generator 27. The counter 28 is responsive to the reset signal P to clear or reset the respective cells or flip-flops 281, 282, 283, 284 and 285.

Thereafter the timing signal T2 as shown in FIG. 8E is obtained from the control circuit 26. Accordingly, the AND gate 286 is opened or enabled, whereby the clock pulse as shown in FIG. 8C is obtained from the AND gate 286 and is applied to the counter 28 as a count input and is also applied to the AND gates 41 and 42. The counter 28 is stepped sequentially responsive to the clock pulse CL thus obtained. The count value of the counter 28 is converted into an analog voltage or a direct current voltage by means of the digital/analog converter 29. As the count value in the counter 28 is stepped sequentially, the direct current voltage is in succession summed up, so that the output from the digital/analog converter 29 increases stepwise as shown in FIG. 8D. The direct current voltage from the comparison signal generator 27, i.e. the digital/analog converter 29 is applied to the comparator 32 of the compare circuit 30. Accordingly, the comparator 32 compares the comparison voltage thus obtained with the reference voltage obtained from the reference voltage generator 31. As seen from FIG. 8D, at the beginning the reference voltage is larger than the comparison voltage and thus the comparator 322 included in the comparator 32 provides the output of the high level or the logic one. Therefore, the corresponding AND gate 42 is opened or enabled.

Since the AND gate 42 has been supplied with the clock pulse from the AND gate 286, the clock pulse is obtained from the AND gate 42 during the time period when the output is obtained from the comparator 322, i.e. during the time period when the comparison signal voltage obtained from the comparison signal generator 27 is smaller than the reference voltage obtained from the reference voltage generator 31. The clock pulse obtained from the AND gate 42 is applied to the AND gate 203 as one input thereto. The AND gate 203 is further supplied with the AM band voltage $V_{AM}$. Accordingly, at that time the clock pulse is obtained from the AND gate 203 and thus the clock pulse is obtained from the OR gate 204, as shown in FIG. 8F. Therefore, the decimal counter 21 is stepped responsive to the clock pulse. If and when the comparison voltage obtained from the digital/analog converter 29 becomes equal to the reference voltage obtained from the reference voltage generator 31, the AND gate 42 is closed or disabled, whereby the clock pulse is not applied from the OR gate 204. This means that the value in the presettable decimal counter 21 is corrected responsive to the clock pulse obtained when the comparison signal voltage is smaller than the reference voltage.

The variable resistor 312 for correction is operated in the manner described in the following. More specifically, at the outset, the radio receiver shown in FIG. 1 is tuned to the frequency of a broadcasting station the frequency of which is known or the frequency of the signal obtained from a given standard signal generator. When the radio receiver is brought to an optimum reception state with respect to the broadcasting signal or the standard signal, then the variable resistor 312 is adjusted such that the frequency being received is indicated by the display 25.

Thereafter the timing signal shown in FIG. 8H is obtained from the control circuit 26. As described previously, the timing signal T3 has a predetermined time period, say 10 m sec. At that time the local oscillation frequency signal as shown in FIG. 8G has been obtained from the AM local oscillator 10 (FIG. 1) and thus from the interface circuit 16 (FIG. 1). The local oscillation frequency signal is applied to the AND gate 201 as one input thereto. Accordingly, if and when the timing signal T3 is obtained, the AND gate 201 is opened or enabled, whereby the AM local oscillation frequency signal is obtained from the OR gate 204. Accordingly, the decimal counter 21 is successively stepped. At that time, the decimal counter 21 has been further stepped responsive to the above described correction clock pulse from the numerical value "99529", for example, as preset from the preset circuit 22. Thereafter, the AM local oscillation frequency signal is in succession added and as a result the decimal counter 21 comes to provide a count value representing the frequency being presently received by the radio receiver. The count value in the decimal counter 21 is latched in the latch circuit 23 responsive to the timing signal T4 (FIG. 8I) thereafter obtained. Thus, the frequency being received is displayed in the display 25 in a digital manner. The operator judges whether the frequency being displayed is equal to the frequency being presently received through a look at the digital display and, if both are not equal, then the variable resistor 312 in the above described reference voltage generator 31 may be adjusted to vary the reference voltage. Through repetition of the above described operations, the correct frequency being received is displayed by the display 25. Thus, the preset value as preloaded in the counter 21 is kept in a corrected state as corrected by the variable resistor 312 and thereafter the display 25 necessarily displays the correct frequency being received.

It is pointed out that according to the preset invention, any erroneous indication of the frequency being received caused by deviation of the intermediate frequency in the intermediate frequency stage can be corrected irrespective of whether the deviation is higher or lower than the prescribed intermediate frequency.

According to the embodiment shown, the range of the frequencies that can be corrected, i.e. thirty-two steps that can be corrected by cascade connection of the five flip-flops 281 to 285 in the counter 28 of the comparison signal generator 27 in the embodiment shown, is divided into two, and the two divided number "16" is further subtracted from the preset value when the value is preloaded in the preset counter 21, as described previously. Accordingly, the value as preset in the presettable decimal counter 21 at the beginning is the minimum value and correction is made in succession through adjustment of the variable resistor 311 or 312 starting from the minimum value. Thus, if and when the actual intermediate frequency of the radio receiver as manufactured is lower than the prescribed intermediate frequency, then "the number for correction" being added to the preset counter is larger than "17", whereas if and when the actual intermediate frequency of the radio receiver as manufactured is higher than the prescribed intermediate frequency, then "the number for correction" is smaller than "15". If and when the actual intermediate frequency of the radio receiver as manufactured is exactly the same as the prescribed intermediate frequency, then "the number for correction" is "16". Thus, according to the embodiment shown, any deviation of the actual intermediate frequency in the intermediate frequency stage in the radio receiver as manufactured from the prescribed intermediate frequency in either the downward direction or upward direction can be corrected.

The relation of the number being preset in the preset counter 21, "the number for correction" and the local oscillation frequency signal will now be specifically described. By way of an example, let it be assumed that the preset value of the preset counter 21 is "99529" as described previously and correction is made by the above described "number for correction" to "99545". Further let it be assumed that the number of the pulses of the local oscillation frequency signal being applied during the time period of the timing signal T3 is "1405". Then, the count number in the preset counter ultimately becomes "950", which is displayed by the display 25 as the frequency being received.

The above described preset circuit will be described in more detail with respect to the case of the FM band. To that end, let it be assumed that the prescribed intermediate frequency employed for the FM band is typically 10.7 MHz and the local oscillation frequency is set above the frequency being received. In such situation the value being preloaded in the preset counter 21 in the preset circuit 22 should be 1000.00−10.70−0.16=989.14. The above described value 0.16, i.e. 0.16 MHz or 160 kHz, is that which is a half of the thirty-two steps selected as the range for "the number for correction" as employed similarly in the above described case of the AM band and is to be in advance deducted, wherein one step has been allotted to each 10 kHz Accordingly, if and when the FM band is selected, the FM band voltage $V_{FM}$ is applied to the preset circuit 22 and the numerical value "6" is obtained as the data J10, the numerical value "4" is obtained as the data J20, the numerical value "9" is obtained as the data J30, the numerical value "8" is obtained as the data J40, and the numerical value "1" is obtained as the data J50, respectively. On the occasion of reception of the FM band, the band selection switch shown in FIG. 1 is turned to the FM contact 15fm, whereby the FM band voltage $V_{FM}$ is obtained. Accordingly, the circuit portions associated with the FM band in the radio receiver shown in FIG. 1 are energized, whereby the radio receiver is placed in the FM reception mode. In substantially the same manner as described previously in conjunction with the FM band reception, the radio receiver is tuned to the broadcasting signal or the signal obtained from a standard signal generator the frequency of which is known and the variable resistor 311 for the FM band in the reference voltage generator 31 shown in FIG. 6 is adjusted such that the above described known frequency comes to be displayed correctly by the display 25 at the optimum tuning condition. As a result, as in case of the AM band, a pulse signal for correction is obtained from the AND gate 41 shown in FIG. 2, which is applied to the counter 21 through the OR gate 204. Then, it follows that the previously preset value in the preset counter 21 has been corrected in association with the correction pulse from the preset state.

Figure 9:
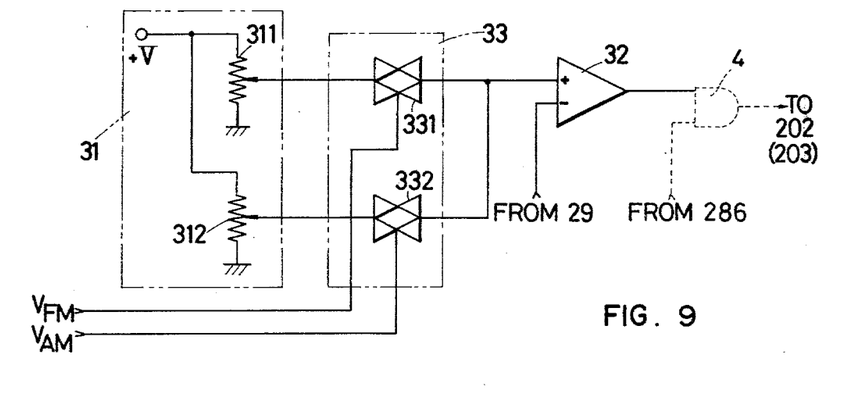
FIG. 9 is a diagram showing in more detail an alternative example of the comparator shown in FIG. 2.

FIG. 9 shows a schematic diagram showing another embodiment of the comparison circuit 30 employed in the present invention. Referring to FIG. 9, the reference voltage generator 31 comprises two variable resistors 311 and 312 which correspond to the frequency bands. One end of each of the variable resistors is commonly connected to the voltage source V, while the other end of each of them is connected to ground. An analog switch 33 is interposed between the reference voltage generator 31 and the comparator 32, which is implemented by a single comparator, as different from the case of the FIG. 6 embodiment. The analog switch 33 comprises an analog switch or transfer gate 331 for the FM band and an analog switch or transfer gate 332 for the AM band. The FM band voltage $V_{FM}$ is applied to the analog switch 331, while the AM band voltage $V_{AM}$ is applied to the analog switch 332. If and when the voltage $V_{FM}$ is obtained, the transfer gate 331 is opened or enabled, whereas if and when the voltage $V_{AM}$ is applied, the transfer gate 332 is opened or enabled. The outputs of the analog switches or transfer gates 331 and 332 are commonly applied to the plus input of the single comparator 32. The comparison signal voltage obtained from the comparison signal generator 27, i.e. the digital/analog converter 29 is applied to the minus input of the comparator 32. The output of the comparator 32 is applied to the common AND gate 43 shown by the dotted line in FIG. 4. The clock pulse obtained from the AND gate 286 is also applied to the AND gate 43 as the other input thereto. With such a structure, the comparator 32 and the AND gate 43 each may be implemented by a single unit commonly effective for the respective bands.

Figure 10:
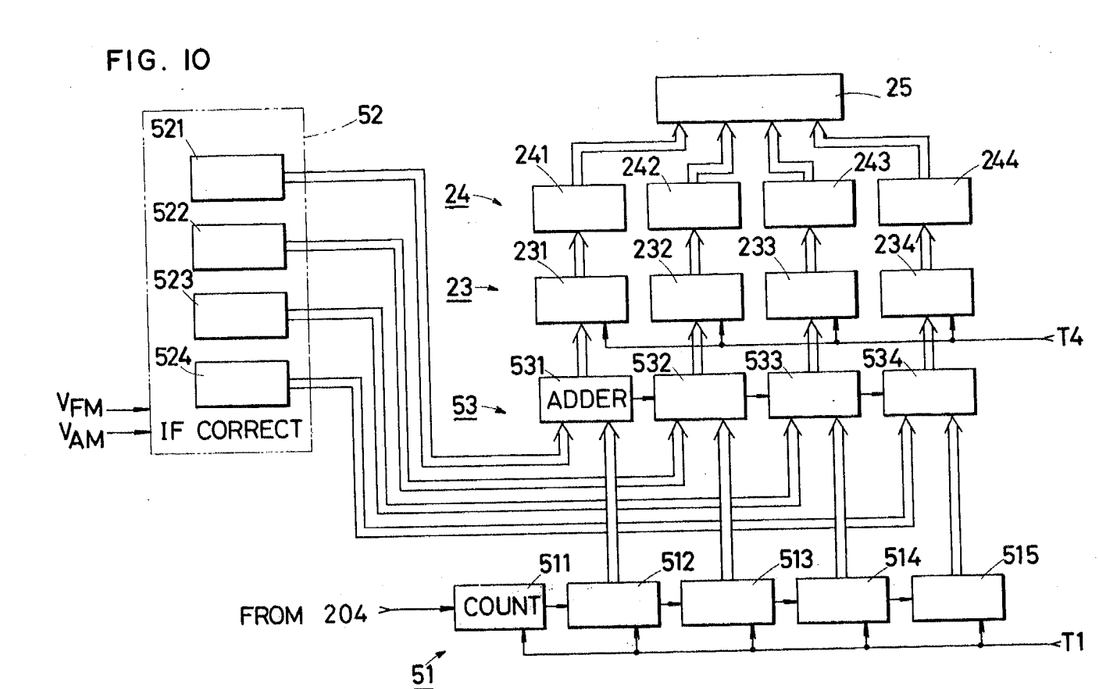
FIG. 10 shows a block diagram of another embodiment of the present invention.

FIG. 10 is a block diagram showing a major portion of another embodiment of the present invention. In the embodiment shown, an ordinary decimal counter 51 has been substituted for the presettable decimal counter 21 of the FIG. 2 embodiment. The count input of the decimal counter 51 is supplied with the output from the OR gate 204, as in case of the FIG. 2 embodiment. The respective digit counters 511, 512, 513, 514 and 515 of the decimal counter 51 are supplied with the timing signal T1 from the timing control circuit 26, so that the same serves as a reset or clear signal. The outputs of the four more significant digit counters 512, 513, 514 and 515 of the decimal counter 51 are applied in a bit parallel fashion to the corresponding adders 531, 532, 533 and 534, respectively. The adder 53 is further supplied with the output from the intermediate frequency correcting circuit 52. More specifically, the intermediate frequency correcting circuit 52 comprises the circuits 521, 522, 523 and 524 corresponding to the respective digit adders 531, 532, 533 and 534 of the adder 53. The outputs of the respective digits of the correcting circuit 52 are applied in a bit parallel fashion to the corresponding ones of the adder 53.

Figure 11:
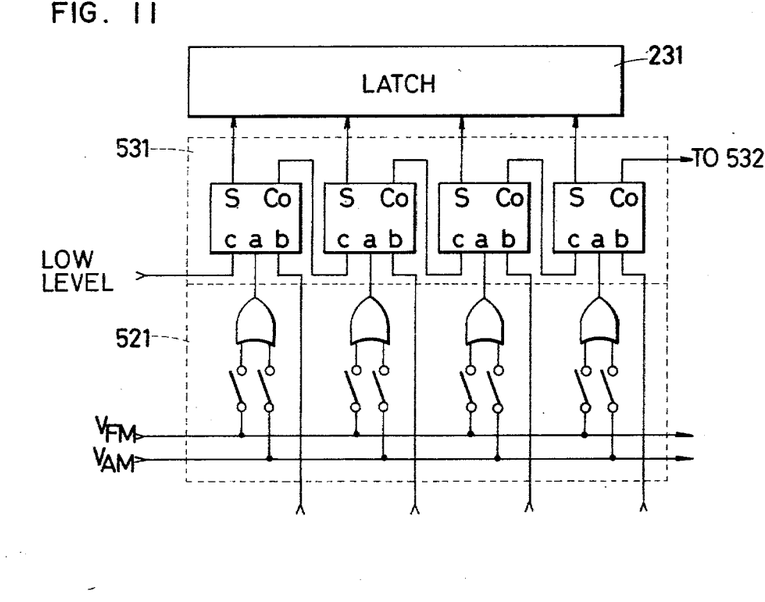
FIG. 11 is a diagram showing in more detail an intermediate frequency correcting circuit and an adder shown in FIG. 10.

FIG. 11 is a diagram showing one digit portion of the intermediate frequency correcting circuit 52 and the adder 53 of the FIG. 10 embodiment. The remaining digit portions may be structured in substantially the same manner. As seen from FIG. 11, the intermediate frequency correcting circuit is similar to the preset circuit described previously. The adder 531 comprises a four-bit full adder, wherein the output from the intermediate frequency correcting circuit 521 is added to the output obtained from the decimal counter 512 to provide the result to the latch circuit 231. At that time the input c of the least significant digit adder 531 is brought to the low level, while the input c of each of the remaining adders is connected to receive a carry output Co of the preceding stage.

Figure 12:
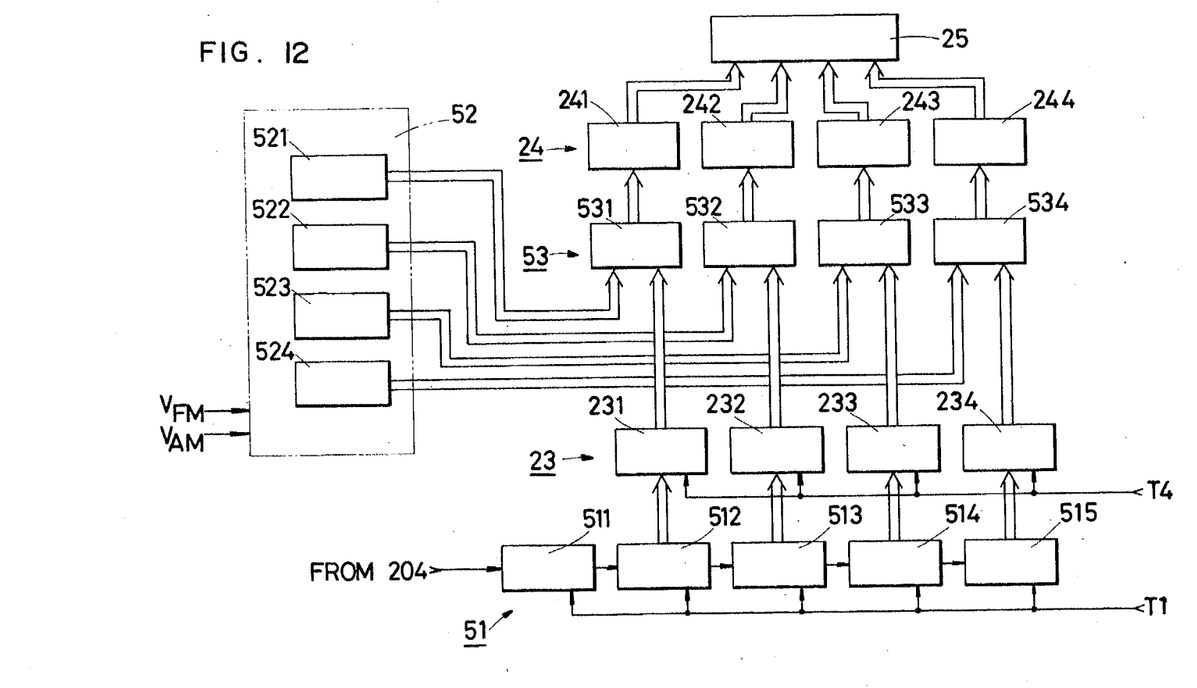
FIG. 12 shows a block diagram of a further embodiment of the present invention.

FIG. 12 is a block diagram showing a major portion of a further embodiment of the present invention. The FIG. 12 embodiment is different from the FIG. 10 embodiment in the following respects. More specifically, although in the FIG. 10 embodiment the output from the intermediate frequency correcting circuit 52 and the output from the decimal counter 51 were subjected to addition before the same is applied to the latch circuit 23, in the FIG. 12 embodiment, addition is carried out before the data is applied from the latch circuit to the display decoder.

Although the preset circuit 22 and the intermediate frequency correcting circuit 52 described in the foregoing embodiments may be implemented in the same structure, the same may be structured such that the numerical values associated with different intermediate frequencies may be set for not only to the FM and AM bands but also to other different frequency bands. For example, taking an example of the FM band, two types of setting can be employed by selecting the local oscillation frequency to be higher or lower than the frequency being received by the frequency difference commensurate with the intermediate frequency. Further in case of the AM band, the invention can be practiced such that selection can be made among different intermediate frequencies, such as 455 kHz, 459 kHz, 470 kHz and the like so as to correspond to different standards for the intermediate frequency employed in different countries.

In the above described embodiments, it was adapted such that the clock pulse is applied to a decimal counter in association with the deviation for the purpose of correcting the deviation based on the difference between the actual resonance frequency of the intermediate frequency stage and the prescribed intermediate frequency. However, the invention may be practiced such that the clock pulse the number of which is associated with the deviation is not applied directly to the counter but instead the number is counted whereupon the same is added to or subtracted from the value in the counter, just done in the embodiments shown in FIGS. 10 and 12, wherein the intermediate frequency associated value was corrected by the use of the intermediate frequency correcting circuit and the counter. Alternatively, the present invention can be practiced such that analog/digital conversion is effected directly to a decimal code based on the difference voltage between the reference voltage and the comparison voltage, whereupon the same is added to or subtracted from the value in the counter.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A display for displaying in a digital manner a frequency received by a superheterodyne receiver including high frequency signal receiving means for receiving a high frequency signal, local oscillating means for generating a local oscillation frequency signal the frequency of which is different by a given frequency difference from that of said high frequency signal, mixing means responsive to said high frequency signal receiving means and said local oscillating means for mixing said high frequency signal with said local oscillation frequency signal for providing an intermediate frequency signal, and intermediate frequency signal amplifying means having a given resonance frequency characteristic and responsive to said mixing means for amplifying said intermediate frequency signal, said display comprising gate means coupled to said local oscillating means for gating said local oscillation frequency signal, counter means responsive to said gate means for counting the number of cycles of said local oscillation frequency signal obtained from said gate means, digital display means coupled to said counter means for displaying in a digital manner the data in said counter means, means for generating numerical data representing a prescribed intermediate frequency, means responsive to said numerical data obtained from said means for generating numerical data representing a prescribed intermediate frequency for modifying the data fed from said counter means to said digital display means, and means compensating for the difference between the resonance frequency of said intermediate frequency amplifying means and said prescribed intermediate frequency by correcting said count data fed from said counter means to said digital display means.

2. A display for a frequency received by a radio receiver in accordance with claim 1, which further comprises interface circuit means coupled between said local oscillating means and said gate means for applying said local oscillation frequency signal to said gate means.

3. A display for a frequency received by a radio receiver in accordance with claim 2, wherein said interface circuit means comprises buffer means adapted for receiving said local oscillation frequency signal.

4. A display for a frequency received by a radio receiver in accordance with claim 2, wherein said interface circuit means comprises frequency dividing means for dividing said local oscillation frequency signal obtained from said local oscillating means at a predetermined frequency division rate.

5. A display for a frequency received by a radio receiver in accordance with claim 1, wherein said gate means comprises means for generating a rate signal of a predetermined time period, and AND gate means for receiving said local oscillation frequency signal obtained from said local oscillating means and said gate signal obtained from said gate signal generating means.

6. A display for a frequency received by a radio receiver in accordance with claim 5, wherein said predetermined time period of said gate signal obtained from said gate signal generating means is selected in association with the minimum frequency the cycles of which can be counted by said counter means.

7. A display for a frequency received by a radio receiver in accordance with claim 1, wherein said means for generating numerical data representing said prescribed intermediate frequency generates said numerical data in a fixed manner.

8. A display for a frequency received by a radio receiver in accordance with claim 7, wherein
said radio receiver includes means for selectively receiving a plurality of frequency bands, and
said means for generating numerical data representing said prescribed intermediate frequency providing numerical data respectively corresponding to said plurality of frequency bands, and
said radio receiver further comprises band selecting means for selecting said plurality of frequency bands, whereby said numerical data generating means is switched to respectively provide said numerical data to correspond to the selected band in response to said band selecting means.

9. A display for a frequency received by a radio receiver in accordance with claim 7, wherein said means for generating numerical data representing said prescribed intermediate frequency comprises memory means.

10. A display for a frequency received by a radio receiver in accordance with claim 1, wherein
said counter means comprises presettable decimal counter means, and
said modifying means presetting said presettable decimal counter means with said numerical data representing said prescribed intermediate frequency.

11. A display for a frequency received by a radio receiver in accordance with claim 1, wherein
said counter means comprises decimal counter means, and
said modifying means comprises addition/subtraction means for adding/subtracting said numerical data representing said prescribed intermediate frequency to/from the count value in said decimal counter means.

12. A display for a frequency received by a radio receiver in accordance with claim 1, which further comprises control circuit means, and wherein
said control circuit means is adapted for generating a plurality of timing signals including first, second, third and fourth timing signals,
said modifying means being adapted for modifying the data fed from said counter means to said digital display means at the time of said first timing signal,
said correcting means being adapted for correcting said data fed from said counter means to said digital display means at the time of said second timing signal,
said gate correcting means being adapted for gating said local oscillation frequency signal to said counter means at the time of said third timing signal, and
said digital display means being adapted for displaying the counter value in said counter means at the time of said fourth timing signal.

13. A display for a frequency received by a radio receiver in accordance with claim 1, wherein said compensating means comprises
means for generating a variable reference signal voltage,
means for generating a comparison signal voltage,
means for comparing said reference signal voltage and said comparison signal voltage,
means responsive to said comparison by said comparing means for generating correction data, and
means responsive to said correction data for correcting count data fed from said counter means to said digital display means.

14. A display for a frequency received by a radio receiver in accordance with claim 13, wherein said means for generating a variable reference signal voltage comprises a variable resistor.

15. A display for a frequency received by a radio receiver in accordance with claim 14, wherein
said radio receiver includes means to selectively receive a plurality of frequency bands, and
said variable resistor comprises a plurality of variable resistors each corresponding to a respective one of said plurality of frequency bands.

16. A display for a frequency received by a radio receiver in accordance with claim 13, wherein said comparison signal voltage generating means comprises
clock pulse source means for providing clock pulses,
binary counter means coupled to said clock pulse source means for counting said clock pluses, and
digital/analog converter means for converting the count output of said binary counter means into an analog voltage as said comparison signal voltage.

17. A display for a frequency received by a radio receiver in accordance with claim 16, wherein said correction data generating means comprises AND gate means adapted for receiving said clock pulses and the output of said comparing means.

18. A display for a frequency received by a radio receiver in accordance with claim 17, wherein said means for correcting count data further comprises gate means for gating the output of said AND gate means to said counter means.

19. A display for a frequency received by a radio receiver in accordance with claim 17, wherein said means for correcting count data further comprises
counting means for counting the clock pulses obtained from said AND gate means,
said counting means modifying the count value of said local oscillator counter means in response to said clock pulses from said AND gate means.

20. A display for a frequency received by a radio receiver in accordance with claim 16, wherein said means for providing numerical data representing said prescribed intermediate frequency is adapted for adding an intermediary numerical value corresponding to a plurality of correcting stages as determined by said binary counter means to said numerical data representing said prescribed intermediate frequency, whereby deviation of the resonance frequency of said intermediate frequency amplifying means being corrected by said compensating means can be corrected irrespective of whether said resonance frequency is higher or lower than said prescribed intermediate frequency.

* * * * *